(12) United States Patent
Martin et al.

(10) Patent No.: US 9,799,490 B2
(45) Date of Patent: Oct. 24, 2017

(54) CHARGED PARTICLE BEAM PROCESSING USING PROCESS GAS AND COOLED SURFACE

(71) Applicant: FEI Company, Hillsboro, OR (US)

(72) Inventors: Aiden Martin, Crows Nest (AU); Geoff McCredie, Darlington (AU); Milos Toth, Redfern (AU)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/674,558

(22) Filed: Mar. 31, 2015

(65) Prior Publication Data
US 2016/0293380 A1 Oct. 6, 2016

(51) Int. Cl.
| | | |
|---|---|---|
| *A61N 5/00* | (2006.01) |
| *H01J 37/32* | (2006.01) |
| *H01J 37/18* | (2006.01) |
| *H01J 37/305* | (2006.01) |
| *H01J 37/317* | (2006.01) |
| *H01J 37/30* | (2006.01) |

(52) U.S. Cl.
CPC ............ *H01J 37/32* (2013.01); *H01J 37/18* (2013.01); *H01J 37/3002* (2013.01); *H01J 37/3056* (2013.01); *H01J 37/3178* (2013.01); *H01J 2237/002* (2013.01); *H01J 2237/006* (2013.01); *H01J 2237/022* (2013.01); *H01J 2237/2003* (2013.01); *H01J 2237/24445* (2013.01); *H01J 2237/30472* (2013.01); *H01J 2237/317* (2013.01)

(58) Field of Classification Search
CPC .......... H01J 37/32; H01J 37/317; H01J 37/36; H01J 37/3171; H01J 37/3172
USPC .......... 250/492.1, 492.2, 492.21, 492.3, 306, 250/307, 311, 440.11, 441.11, 443.1
See application file for complete search history.

(56) References Cited

U.S. PATENT DOCUMENTS

| | | | | |
|---|---|---|---|---|
| 3,908,041 | A | * | 9/1975 | Engl ...................... H01C 17/20 216/16 |
| 4,785,182 | A | | 11/1988 | Mancuso et al. |
| 5,265,463 | A | * | 11/1993 | Loebig ................. G01N 15/082 73/23.2 |
| 6,660,647 | B1 | * | 12/2003 | Ono .................. H01J 37/32082 156/345.36 |
| 8,617,668 | B2 | | 12/2013 | Toth et al. |
| 2006/0065853 | A1 | | 3/2006 | Rue et al. |

(Continued)

FOREIGN PATENT DOCUMENTS

| | | |
|---|---|---|
| JP | 2003308801 | 10/2003 |
| WO | 2008098084 A1 | 8/2008 |

OTHER PUBLICATIONS

Fox, D., et al., "Nitrogen assisted etcing of graphene layers in a scanning electron microscope," Applied Physics Letters, 2011, vol. 98, No. 243117, pp. 1-3.

(Continued)

*Primary Examiner* — Jason McCormack
(74) *Attorney, Agent, or Firm* — John E. Hillert; Michael O. Scheinberg; Scheinberg & Associates, P.C.

(57) ABSTRACT

A cold trap is provided to reduce contamination gases that react with the beam during operations that use a process gas. The cold trap is set to a temperature that condenses the contamination gas but does not condense the process gas. Cold traps may be used in the sample chamber and in the gas line.

23 Claims, 5 Drawing Sheets

(56) References Cited

U.S. PATENT DOCUMENTS

| | | | |
|---|---|---|---|
| 2009/0152460 A1 | 6/2009 | Buhler et al. | |
| 2011/0031394 A1* | 2/2011 | Knowles | H01J 37/301 250/307 |
| 2011/0183523 A1 | 7/2011 | Auth et al. | |
| 2011/0215242 A1* | 9/2011 | Preikszas | H01J 37/05 250/307 |
| 2012/0003394 A1* | 1/2012 | Mulders | C23C 16/26 427/551 |
| 2012/0112062 A1* | 5/2012 | Novak | H01J 37/18 250/307 |
| 2013/0068611 A1 | 3/2013 | Botman et al. | |
| 2013/0284923 A1* | 10/2013 | Hatano | H01J 37/18 250/310 |
| 2013/0288182 A1* | 10/2013 | Branton | B81C 1/00531 430/296 |
| 2013/0320204 A1* | 12/2013 | Komatsu | H01J 49/0468 250/282 |
| 2014/0034830 A1* | 2/2014 | Castagna | H01J 37/26 250/307 |
| 2014/0271324 A1* | 9/2014 | Pinkerton | H01F 41/0266 419/28 |
| 2014/0363978 A1 | 12/2014 | Martin et al. | |
| 2016/0071687 A1* | 3/2016 | Tsuchiya | G01N 1/42 250/307 |

OTHER PUBLICATIONS

Lan, Yan-Wen, et al., Polymer-Free Patterning of Graphene at Sub-10-nm Scale by Low-Energy Repetitive Electron Beam, Small, 2014, vol. 10, No. 22, pp. 4778-4784.

Niitsuma, Jun-Ichi, et al., "Nanoprocessing of Diamond Using a Variable Pressure Scanning Electron Microscope," Japanese Journal of Applied Physics, 2006, vol. 45, No. 2, pp. L71-L73.

Unknown, Aloha CVD/ALD Materials by Air Liquide Electronics, TMCTS Physical Chemical Properties Physical State Liquid Melting Point; Retrieved from the Internet Aug. 11, 2016; http://airliquide.com/au/file/otherelement/pj/tmcts%20Ir%20wo%20spec48473.pdf.

* cited by examiner

| | Environment | Pressure (Pa) | Gas line cold trap temperature (K) | Reaction cell cold trap temperature (K) | Depth (nm) |
|---|---|---|---|---|---|
| 202 | High vacuum | $3*10^{-4}$ | 298 | 298 | 62, 37 |
| 204 | Ar | 13 | 298 | 298 | 417 |
| 206 | Ar | 13 | approx. 77 | 298 | 234, 196, 220 |
| 208 | Ar | 13 | approx. 77 | approx. 218 | 48, 64, 50, 54 |
| 210 | $N_2$ | 13 | approx. 77 | 298 | 169 |

CHARGED PARTICLE BEAM PROCESSING USING PROCESS GAS AND COOLED SURFACE

TECHNICAL FIELD OF THE INVENTION

The present invention relates to charged particle beam processing using a process gas.

BACKGROUND OF THE INVENTION

In a scanning electron microscope ("SEM"), a primary beam of electrons is scanned upon a region of a sample that is to be investigated. The energy released in the impact of the electrons with the sample causes the emission of x-rays and secondary electrons, including backscattered electrons, from the sample. The quantity and energy of these x-rays and secondary electrons provide information on the nature, structure and composition of the sample. The term "sample" is traditionally used to indicate any work piece being processed or observed in a charged particle beam system and the term as used herein includes any work piece and is not limited to a sample that is being used as a representative of a larger population. The term "secondary electrons" as used herein includes backscattered primary electrons, as well as electrons originating from the sample. To detect secondary electrons, a SEM is often provided with one or more electron detectors.

The electron beam can also be used to initiate a chemical reaction at the sample surface. Process gases are used with charged particle beams to alter the work piece. "Beam chemistry" refers to chemical reactions initiated by a beam, such as a charged particle beam or a laser beam. "Electron beam chemistry" includes electron beam-induced deposition (EBID), electron beam-induced etching (EBIE) and electron beam-induced functionalization (EBIF) and is typically performed in a scanning electron microscope (SEM). In all of these electron beam processes, molecules of a precursor gas are adsorbed onto a work piece surface. An electron beam is directed at the work piece, and the electrons in the beam and the emitted secondary electrons dissociate the adsorbates, generating reaction products. In EBID, non-volatile reaction products remain on the substrate surface as a deposit, while volatile reaction products desorb. In EBIE, one or more of the precursor molecule decomposition products react with the work piece surface, generating volatile reaction products that desorb from the work piece, removing surface material. In EBIF, the electron beam-induced surface reaction changes the elemental or molecular species that terminates the work piece surface. Similar processes occur in ion beam-induced deposition (IBID), ion beam-induced etching (IBIE), and ion beam-induced functionalization (IBIF), although the much greater mass of the ions also causes material to be removed from the substrate by sputtering, that is, by momentum transfer from the energetic ions, without any chemical reaction. The mechanism by which the ion beam interacts with the adsorbate is thought to be different from the mechanism by which the electron beam reacts with the adsorbate.

In a conventional SEM, the sample is maintained in a high vacuum to prevent scattering of the primary electron beam by gas molecules and to permit collection of the secondary electrons. Beam chemistry is typically performed in the vacuum chamber using a gas injection system having a capillary needle that directs gas toward the impact point of the beam. The gas expands rapidly and while the local gas pressure at the surface is sufficient to support beam-induced reactions, the pressure in the rest of the sample chamber is sufficiently low that secondary electrons can be detected using a conventional detector, such as the scintillator-photomultiplier combination commonly referred to as an Everhart-Thornley detector.

Electron beam chemistry can also be performed with a work piece in an environment flooded with the precursor gas. One type of electron microscope in which the sample is maintained in a gaseous environment is an High Pressure Scanning Electron Microscope (HPSEM) or Environmental Scanning Electron Microscope. Such a system is described, for example, in U.S. Pat. No. 4,785,182 to Mancuso et al., entitled "Secondary Electron Detector for Use in a Gaseous Atmosphere." An example is the Quanta 600 ESEM® high pressure SEM from FEI Company.

In an HPSEM, the sample is maintained in a gaseous atmosphere having a pressure typically between 0.01 Torr (0.013 mbar) and 50 Torr (65 mbar), and more typically between 1 Torr (1.3 mbar) and 10 Torr (13 mbar). The region of high gas pressure is limited to the sample region by one or more pressure-limiting apertures that maintain a high vacuum in the focusing column. By contrast, in a conventional SEM the sample is located in vacuum of substantially lower pressure, typically less than $10^{-5}$ Torr ($1.3 \times 10^{-5}$ mbar). In an HPSEM, secondary electrons are typically detected using a process known as "gas ionization cascade amplification" or "gas cascade amplification," in which the secondary charged particles are accelerated by an electric field and collide with gas molecules in an imaging gas to create additional charged particles, which in turn collide with other gas molecules to produce still additional charged particles. This cascade continues until a greatly increased number of charged particles are detected as an electrical current at a detector electrode. In some embodiments, each secondary electron from the sample surface generates, for example, more than 20, more than 100, or more than 1,000 additional electrons, depending upon the gas pressure and the electrode configuration. In some embodiments positive gas ions or photons generated in the gas cascade are detected instead of electrons and used to generate an image. The term "gas cascade amplification imaging" as used herein refers to images generated using any combination of these three imaging signals. The term "gas cascade detector" as used herein refers to a detector that can be used to detect any combination of these three imaging signals.

As described in U.S. Pat. Pub. 2014/0363978 to Martin et al for "Electron Beam-Induced Etching," which is assigned to the assignee of the present invention and which is hereby incorporated by reference, HPSEMs have several problems when used for beam chemistry. Impurities are introduced by desorption from surfaces inside the sample chamber, and by diffusion through o-rings typically used on SEM and HPSEM chambers. The impurities are comprised primarily of $H_2O$, $N_2$ and $O_2$ and were not considered to interfere with conventional HPSEM imaging operations, which entails filling the chamber with a gas such as $H_2O$ vapor for the purpose of charge control and stabilization of vacuum-incompatible samples. The impurities do, however, interfere with beam chemistry because molecules such as $H_2O$ and $O_2$ react with and cause the decomposition of deposition and etch precursors such as most organometallics, $WF_6$, $MoF_6$, $Pt(PF_3)_4$, $XeF_2$, $F_2$ and $Cl_2$. The impurities also occupy surface sites at the sample surface thereby reducing the adsorption rate of precursor molecules used for beam chemistry; and cause the oxidation of materials such as W and Mo during deposition and thereby alter the composition and functional properties of the deposited material. The solution proposed by U.S. Pat. Pub. 2014/0363978 is to cool the work piece to a temperature near the boiling point of the precursor gas to provide high precursor surface coverage without condensation.

Another method used to provide improved control in a high pressure sample environment is the use of an "environmental cell" inside the sample chamber. By "environmental cell" is meant an enclosure for providing an environment around the sample, typically a different environment than that present in a sample chamber in which the environmental cell is located. An environmental cell can enhance control of the sample environment, reducing the concentration of gaseous impurities present during HPSEM processing, and reducing the volume and inner surface area of the HPSEM process chamber. PCT/US2008/053223, which is assigned to the assignees of the present application and which is hereby incorporated by reference, describes several configurations of environmental cells.

Another method to reduce contamination in a vacuum chamber is to use a cryotrap (also referred to as a "cold trap"), that is, a cold surface that condenses any gases in the vacuum chamber to improve the vacuum. Cryotraps are not used when a process gas is used, because the vacuum is intentionally degraded with the process gas. Cryotraps are also not used in HPSEM because the vacuum is intentionally degraded by the imaging gas, and the most common imaging gas is $H_2O$ vapor.

Two recent applications of beam chemistry are nanopatterning of graphene and diamond, which have unique electrical and optical properties. Gas-mediated EBIE is increasingly being used for rapid prototyping of functional structures in graphene and diamond because EBIE eliminates damage to the material produced by masking and ion irradiation. EBIE has been used to etch numerous carbon materials including graphene, carbon nanotubes, diamond, ultra nanocrystalline diamond (UNCD), and amorphous carbon-rich nanowires and films. At low electron beam energies (<~30 keV), where atomic displacements by knock-on collisions between electrons and carbon are negligible, the removal of carbon is typically attributed to chemical etching (i.e., volatilization of carbon). The etching is generally ascribed to chemical pathways that involve O, H or OH radicals produced by electron induced dissociation of $H_2O$, $NH_3$ or $H_2$ precursor molecules adsorbed to the surface of the etched material.

Applicants have found that a sample may be inadvertently etched even when no etch precursor gas is supplied. Thus, the sample can be degraded, for example, by unintentional etching during imaging by the electron beam in high vacuum, or when using a non-etching inert imaging gas, or during a deposition process. Such etching of graphene and diamond by low energy electrons have been attributed to mechanisms that include atomic displacements caused by knock-on, electron beam heating, sputtering by ionized gas molecules, and chemical etching driven by a number of gases that include $N_2$. Y. Lan, et al., "Polymer-free Patterning of Graphene at Sub-10 nm Scale by Low-Energy Repetitive Electron Beam," *Small* 10, 4778 (2014). D. Fox, et al., "Nitrogen assisted etching of graphene layers in a scanning electron microscope," *Appl. Phys. Lett.* 98, 243117 (2011) and J. Niitsuma, et al., "Nanoprocessing of Diamond Using a Variable Pressure Scanning Electron Microscope," *Jpn. J. Appl. Phys.* 45, L71 (2006). In particular, it has been reported that electron beam induced removal of carbon from graphene and diamond can be accelerated by introducing $N_2$ into the vacuum chamber. These observations were very surprising and attributed to sputtering and chemical etching of carbon caused by nitrogen ions. When intentionally etching, the etch rate can vary under seemingly identical processing conditions. A method is needed to reduce inadvertent etching in order to produce consistent processing results for producing nanoscale structures, and to enable etch-free high resolution imaging of materials such as graphene, diamond and carbon nanotubes.

SUMMARY OF THE INVENTION

An object of the invention is to provide improved charged particle beam processing, including imaging, with a process gas.

A cold trap is provided to reduce contamination gases that react with the beam during operations that use a process gas. The cold trap is set to a temperature that condenses the contamination gas but does not condense the process gas. Cold traps may be used in the sample chamber and in the gas line.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the invention provide a means for lowering the partial pressure of a contaminant gas in a charged particle beam system, and therefore the areal density of contaminant molecules adsorbed on work piece surfaces irradiated by the charged particle beam. As a result, the innovation detailed below allows for beam processes to be performed while greatly reducing undesired beam chemistry reactions occurring due to the presence of contaminants in the system.

Methods are provided of lowering the partial pressure of a contaminant gas in a charged particle system through physical immobilization of contaminant molecules which strike an area within the system.

It is has been shown that undesired beam chemistry reactions can occur even in a system which is using ultra-pure inert source gases. Previously, this was thought to be due to beam-induced reactions between otherwise inert gas molecules and the surface of a sample being irradiated by the charged particle beam. However, Applicants have found that the undesired beam-induced reactions occur due to contaminants present in the gas delivery system and the vacuum system, such as contaminants that are adsorbed on the internal surfaces between the gas source and the sample. The internal surfaces include those of any gas lines used and the internal surface of the sample chamber. When the process gas is in contact with these surfaces, adsorbed contaminants can desorb from the surface and contaminate the process gas, effectively raising the partial pressure of contaminant gases within the sample chamber. When a system is operated at a high vacuum without a process gas, many of the adsorbed contaminants remain adsorbed on the surfaces inside the vacuum chamber and are not exposed to the beam and do not react with the sample. Applicants have found that the introduction of a process gas increases the partial pressure of contaminant gases that are delivered to the sample.

In some embodiments, the contaminant is water ($H_2O$). In the presence of a charged particle beam, water can behave as an etchant. Without wishing to be bound by theory, the etching is generally ascribed to chemical pathways that involve O., H., or OH. radicals produced by particle induced dissociation of $H_2O$.

In the following disclosure, the term "downstream" is defined as forward in the direction of gas flow.

Figures 1, 2:
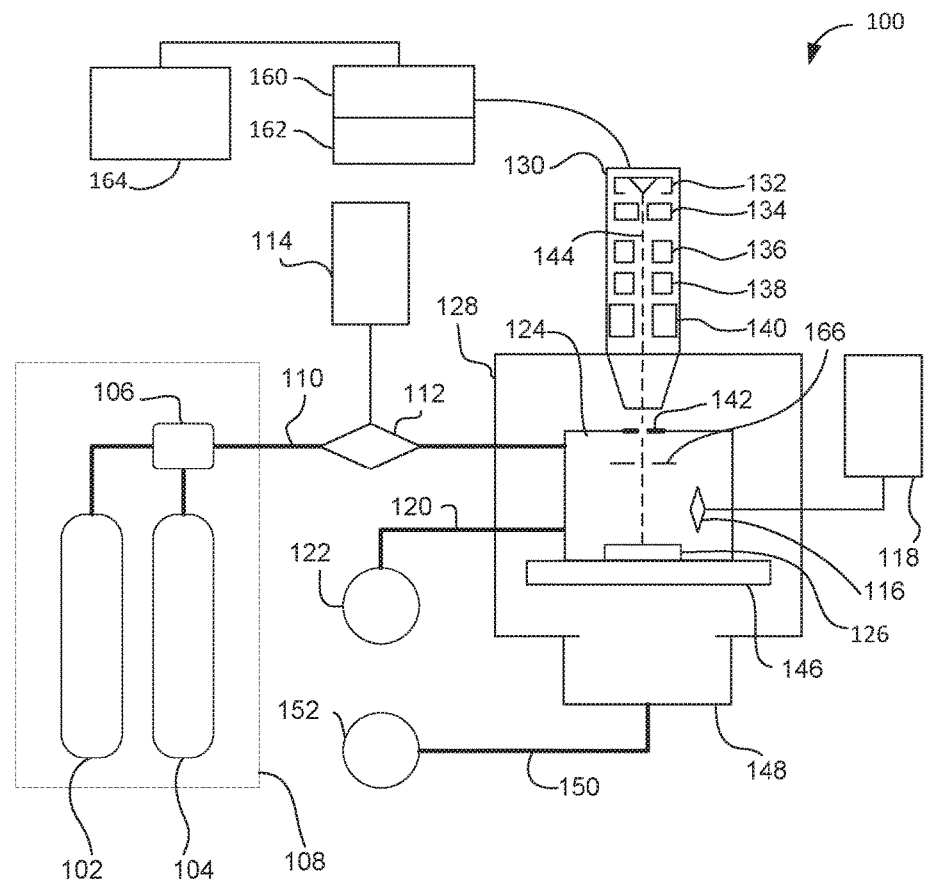
FIG. 1 shows a schematic view of a charged particle beam system with cooled surfaces.
FIG. 2 is a table of etch pit depth vs. cooled surface temperatures for selected gases.

FIG. 1 shows a schematic view of a charged particle beam system 100. The system has gas reservoirs 102 and 104 and a mass flow controller 106, which together comprise a gas source 108. Although two gas reservoirs 102 and 104 are shown, any number of gas reservoirs may be used.

A gas line 110 carries gas downstream from mass flow controller 106. In some embodiments, gas line cold trap 112 is installed on gas line 110. Cooling for gas line cold trap 112 is provided by cooler 114. In some embodiments, cooler 114 may provide cooling via heating or evaporation of liquid nitrogen or another cryogenic liquid, or by other means of cooling which can achieve the desired temperature. For example, mechanical or thermoelectric refrigeration can be used Cold trap 112 is preferably located close to the vacuum chamber so that most of the contaminants present in the gas path are condensed on the cold trap.

Gas line 110 continues into a sample chamber 124, which is enclosed in a vacuum chamber 128 and which contains a sample 126. In some embodiments, gas line 110 passes through the walls of vacuum chamber 128 and sample chamber 124. If a thermoelectric cooler is used, it could be placed inside vacuum chamber 128 or sample chamber 124 and a thermal path provided for heat removed. A sample chamber cold trap 116 is located within sample chamber 124, and cooled via cooler 118. Sample 126 rests on a sample stage 146. Charged particle column 130 produces, focuses, and directs a charged particle beam 144 through a pressure limiting aperture 142 into sample chamber 124. Charged particle column 130 includes a particle source 132, a first charged particle lens 134, deflectors 136 and 138, and a charged particle objective lens 140. Controller 160 controls charge particle beam 100 either from on operator input or from computer readable instruction stored in memory 162. Display 164 displays images formed from secondary electrons amplified by gas cascade amplification within sample chamber 124 and detected by detector electrode 166. Other elements, such as beam blankers and aberration correction elements, are also typically present. In some embodiments, the charged particle beam may be a charged particle beam, such as an electron beam, an ion beam, or a cluster beam. The beam could also be a laser beam—embodiments of the invention may be useful whenever a process gas is used with any type of beam that provides energy to initiate a reaction involving the process gas.

In some embodiments, vacuum chamber 128 is pumped by high-vacuum pump 148, which exhausts into backing pump 152 through vacuum chamber vacuum line 150.

In some embodiments, a pressure gauge 122 is connected to sample chamber 128 by sample chamber pressure line 120 so that an operator can monitor the sample chamber pressure and adjust the flow rate into the chamber to achieve a desired sample chamber pressure.

FIG. 2 shows the electron beam etching effects of different gases and different temperatures and pressures as determined by the depth of etch pits in ultra nano-crystalline diamond (UNCD). Row 202 represents prior art processing at high vacuum, with no process gas being introduced into the vacuum chamber, charged particle irradiation produced pits with depths of 62 and 37 nanometers (nm). The pressure within the sample chamber during irradiation under high vacuum in row 202 is $3*10^{-4}$ pascals (Pa). During high vacuum irradiation, neither gas line cold trap 112 nor sample chamber cold trap 116 were actively cooled, and remained at room temperature. Because no process gas flowed through gas line 110 and there was no process gas in sample chamber 124, the quantity of contaminant gas molecules in the sample chamber is low. Row 204 represents prior art processing using a process gas without the use of a cold trap. Row 204 shows the result of irradiation while the sample chamber is filled to 13 Pa with argon, from an ultra-pure source (99.998+% Ar, ≤3 ppm $H_2O$). During irradiation in row 204, both cold traps 112 and 116 remained at room temperature. Irradiation produced an etch pit 417 nm deep. Without wishing to be bound by theory, it is assumed that the deeper etch pit created in row 204 is the result of contaminants delivered to the sample by the process gas. In particular, it is assumed that $H_2O$ contaminants are adsorbed on the interior surfaces of gas lines leading from the gas source to the sample chamber, as well as the walls of the sample chamber. Said $H_2O$ adsorbates can desorb from the surfaces in the gas path and become entrained with the gas flow to the sample chamber, as well as desorbing from the walls of the sample chamber. While the etching in row 202 is relatively small, in the high vacuum conditions of row 202, when a process gas is applied, the high etch rate of row 204 occurs.

Row 206 shows the results of beam-induced etching under conditions similar to those of row 204, except gas line cold trap 112 is now cooled to about 77 K. The etch pit depths produced are approximately half the depth of those produced during etching in row 204. Without wishing to be bound by theory, it is believed this is due to trapping of contaminants on gas line cold trap 112. However, the pit depths in row 206 are still substantially deeper than those created under high vacuum in row 202. The etching is believed to be due to residual contaminants still present in the sample chamber during charged particle beam irradiation.

Row 208 shows the results of beam-induced etching under conditions similar to that of row 206, except sample chamber cold trap 116 is now cooled to about 218 K. Gas line cold trap 112 remains at about 77K. The etch pit depths produced under the conditions of row 208 are comparable to those obtained under high vacuum, even though the pressure of Ar in the chamber remains the same as in row 206 and 204. Without wishing to be bound by theory, it is believed that cooling sample chamber cold trap to about 218 K causes contaminants in sample chamber 124 to condense on sample chamber cold trap 116, and therefore be effectively removed from the atmosphere in sample chamber 124. Process gas entering sample chamber 124 brings in minimal contamination because gas line cold trap 112 traps contaminants before they can enter the sample chamber 124. Removal of contaminants from the sample chamber atmosphere serves to lower the partial pressure of contaminant gas within the chamber, and therefore reduces the amount of contaminant particles adsorbed per unit area on the sample.

Table 1 shows the typical contaminants, the radicals that are generated by the interaction of an electron beam with the contaminant, and the boiling point of the contaminant at 1 Bar. Contaminants such as $NF_3$, $Cl_2$, $N_2O$ and HCl are present in some charged particle beam systems. For example, said contaminants are found in a charged particle beam system 100 that contains these materials in gas reservoirs such as 102 and 104 located in a multi-gas source 108.

TABLE 1

| Contaminant | Radical Generated | Boiling Point Kelvin (at 1 Bar) |
|---|---|---|
| $SF_6$ | Fluorine | 209.15 |
| $NF_3$ | Fluorine | 144.05 |
| $H_2$ | Hydrogen | 20.28 |
| $NH_3$ | Hydrogen | 239.81 |
| $H_2O$ | Hydrogen | 373.13 |
| $O_2$ | Oxygen | 90.2 |
| $N_2O$ | Oxygen | 184.67 |
| $H_2O$ | Oxygen | 373.13 |
| $Cl_2$ | Chlorine | 239.05 |
| HCl | Chlorine | 188.05 |

The boiling point of the process gas and the boiling point of any expected contaminants can be used as a guide to optimize cold trap temperatures. In some embodiments, the temperature of the cold traps is preferably below the boiling point of any expected contaminant and above the boiling point of the process gas bring used. The temperature of the cold trap is preferably at least 10 degrees, 20 degrees, 30 degrees or at least 50 degrees above the boiling point of the process gas. It is desirable to set the temperature of the cold trap just above the boiling temperature of the process gas to trap as many contaminants as possible. The temperature of the cold trap is preferably less than 10 degrees, less than 20 degrees, less than 30 degrees, less than 50 degrees, or less than 80 degrees below the boiling point of the expected contaminant. These temperatures apply to either the cold trap in the gas line or the cold trap in the sample chamber. As the boiling point varies with the pressure of the gas, the temperature of the cold trap may be varied depending on the pressure of the process gas at the cold trap, the type of process gas used, and the expected contaminants.

In some embodiments, the optimum cold trap temperature is found using the following procedure: (i) the cold trap temperature is set to room temperature and the sample chamber is evacuated to the base pressure of the vacuum system, (ii) the process gas is injected into the sample chamber using a flow rate needed to achieve the desired sample chamber pressure, (iii) the cold trap temperature is reduced gradually until the process gas begins to condense onto the cold trap, (iv) the cold trap temperature is increased slightly to prevent condensation of the process gas. In step (iii) of the above procedure, the process gas condensation temperature can be identified by an abrupt decrease in the sample chamber pressure, or a sudden increase in the flow rate of the process gas needed to maintain the desired sample chamber pressure.

In some embodiments, such that shown in FIG. 1, the sample chamber lacks a gas outlet other than through the PLA 142, into charged particle beam column 130. The rate of gas flow through PLA 142 is small compared to the amount of gas contained in sample chamber 124, and so the rate of gas atmosphere turnover within sample chamber 124 is small. That is, the atmosphere within sample chamber 124 is relatively stagnant. In the prior art, this led to higher ratios of contaminant gas molecules to process gas molecules in the sample chamber 124 because contaminants that desorbed from the chamber walls were not purged as they desorbed. In some embodiments of the present invention, a cold trap removes contaminants in sample chamber 124 and the low flow rate into the chamber means that additional contaminants are introduced at a slow rate, resulting in an overall lower concentration of contaminants. In some embodiments, the combination of effective trapping of contaminants by cold traps 112 and 116 with the low rate of atmosphere turnover within sample chamber 124 allows for the partial pressure of contaminant gas within sample chamber 124 to be reduced to partial pressure comparable to that under high vacuum, such as that in row 202 of FIG. 2.

Row 210 shows results of beam-induced etching under conditions similar to that of row 206, except the process gas is nitrogen ($N_2$) rather than argon. The etch pit depth obtained under the conditions of row 210 are comparable to those obtained in row 206, which tends to indicate that nitrogen is not the source of etching as previously theorized.

The surface of cold traps 116 and 112 may be cooled by, for example, a metered flow of liquid nitrogen or other cold fluid, a mechanical or thermoelectric cooler, such as a Peltier cooler, or other means of cooling. In some embodiments, the cooled surface is cooled to a temperature below room temperature, but above the condensation temperature of the process gas at the pressure being used. In a further embodiment, the surface is cooled to a temperature that will result in contaminant gases within the chamber condensing on the cooled surface, but will not result in the condensation of the process gas being introduced into the chamber.

Figure 3:
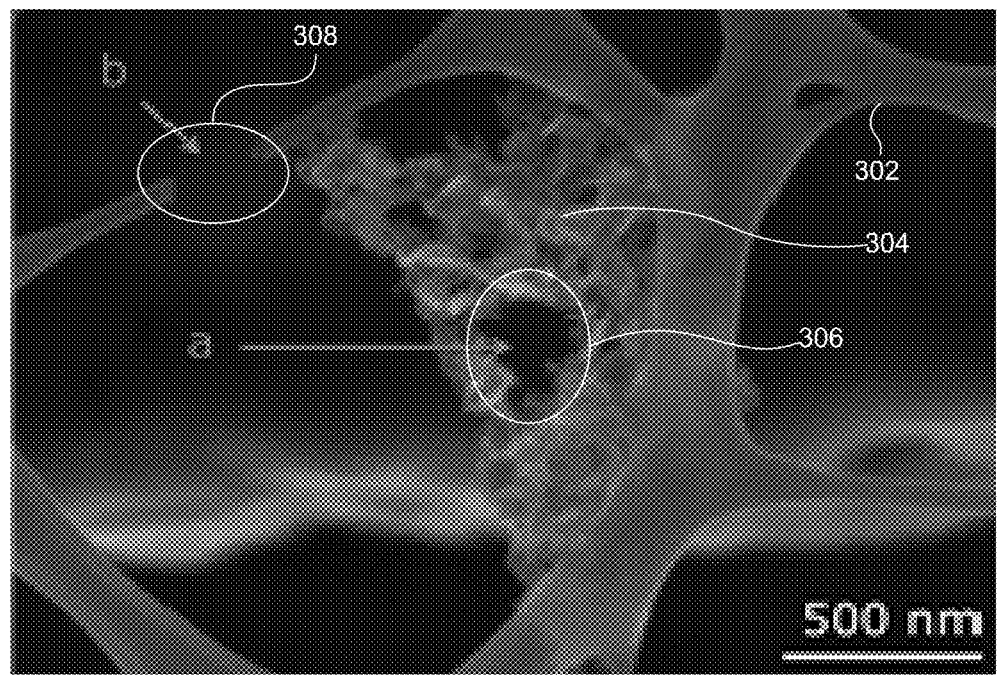
FIG. 3 shows areas of lacy carbon and graphene etched by a charged particle beam.

FIG. 3 shows a photomicrograph of electron beam-induced etching. Lacy carbon 302 and graphene 304 have been etched by exposure to the charged particle beam, and have visible etch regions 306 in graphene and 308 in lacy carbon. The image shown in FIG. 3 was obtained using a low energy electron beam in a high vacuum ($3 \times 10^4$ Pa) environment at room temperature using a field emission gun scanning electron microscope. Hydrocarbon contamination in the vacuum system was minimized by plasma cleaning the SEM chamber prior to loading substrates into the system, and heating substrates in-situ. FIG. 3 shows that in spite of the high vacuum conditions and contamination removal, the sample was still etched by the electron beam.

Figure 4:
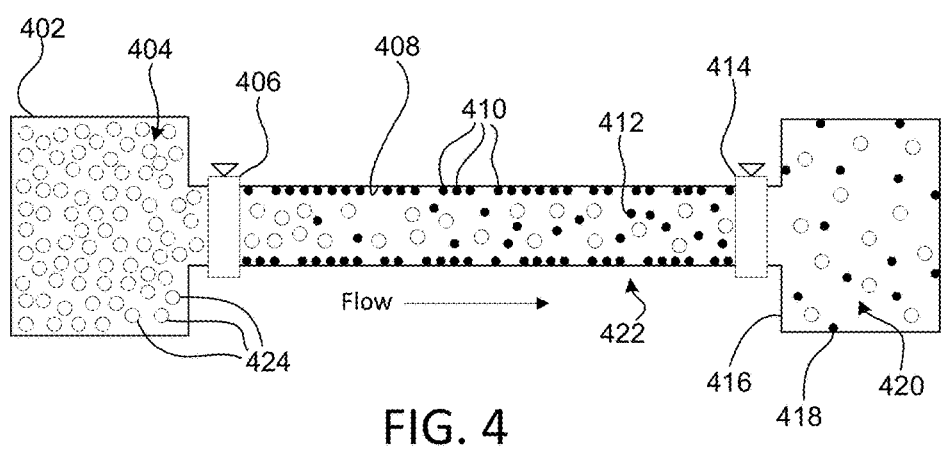
FIG. 4 shows contaminants being introduced into a gas stream.

FIG. 4 shows a process by which contaminants may become entrained within the flow of a process gas 404 from a process gas source 402, through a valve 406, to a sample chamber 416. As process gas 404 flows from process gas source 402 through gas line 422, process gas molecules 424 encounter contaminant molecules 410 adsorbed on the internal surface 408 of gas line 422. Some adsorbed contaminant molecules 410 desorb and become entrained 412 in the process gas flow through valve 414 into sample chamber 416, filling sample chamber 416 with contaminated gas 420.

Some contaminant molecules adsorb 418 on the walls of sample chamber 416, and also on any sample present in the chamber (not shown). In some cases, this process can result in an unacceptable concentration of contaminant in the process gas when it reaches sample chamber 416, even if ultra-pure process gas is used.

Figure 5:
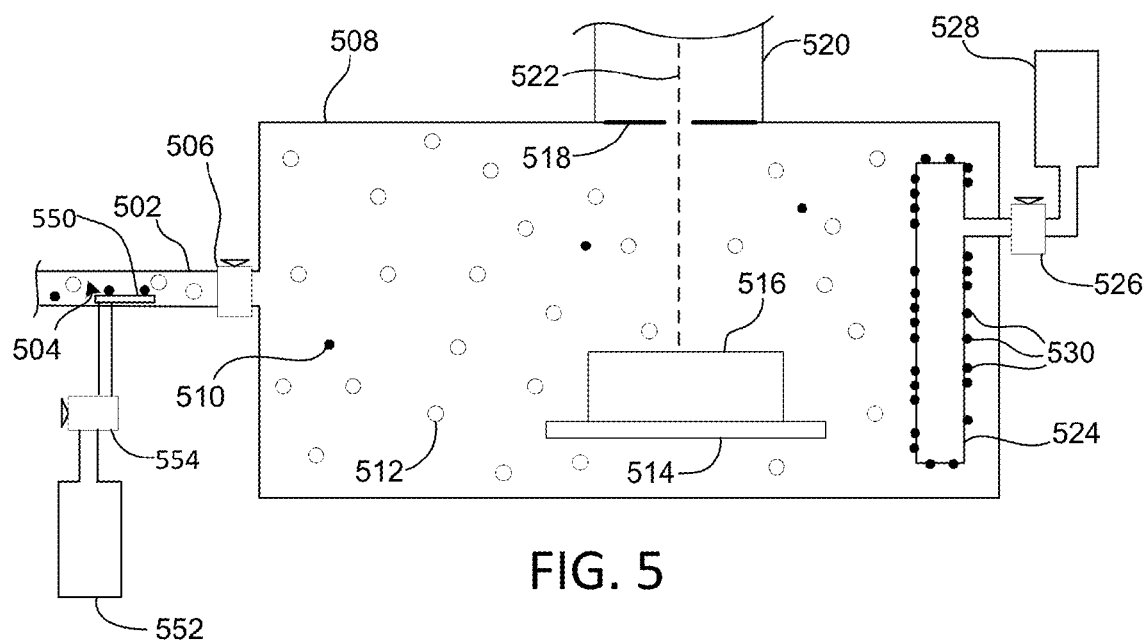
FIG. 5 shows contaminants trapped on a cooled surface inside a charged particle system.

Referring now to FIG. 5, a sample chamber 508 of a charged particle beam system is shown. A gas line cold trap 550 is located in gas line 502. Cold trap 550 is cooled by cooler 552 by flowing a cooling fluid through a valve 554. Process gas 504 is purified by cold trap 550 before it enters sample chamber 508 through a valve 506. Process gas 504 prior to cold trap 550 comprises process gas molecules 512, as well as contaminant molecules 510. Situated above sample chamber 508, and connected to sample chamber 508 by a pressure limiting aperture 518 is a charged particle beam column 520, producing and directing a charged particle beam 522. Located within sample chamber 508 is sample chamber cold trap 524. Cooling for sample chamber cold trap 524 is provided by cooler 528. In some embodiments, cooler 528 provides cooling through metered flow of a cryogen through valve 526. Cooling of sample chamber cold trap 524 causes contaminant molecules 530 to condense on the surface, removing them from the atmosphere within sample chamber 508, and lowering the concentration of contaminant molecules 510 within sample chamber 508. Sample 516 rests on sample stage 514 within sample chamber 508. By lowering the concentration of contaminant molecules coming in to the chamber and by removing contamination in the atmosphere within sample chamber 508, the amount of contaminant molecules adsorbed per unit area on sample 516 is reduced.

Figure 6:
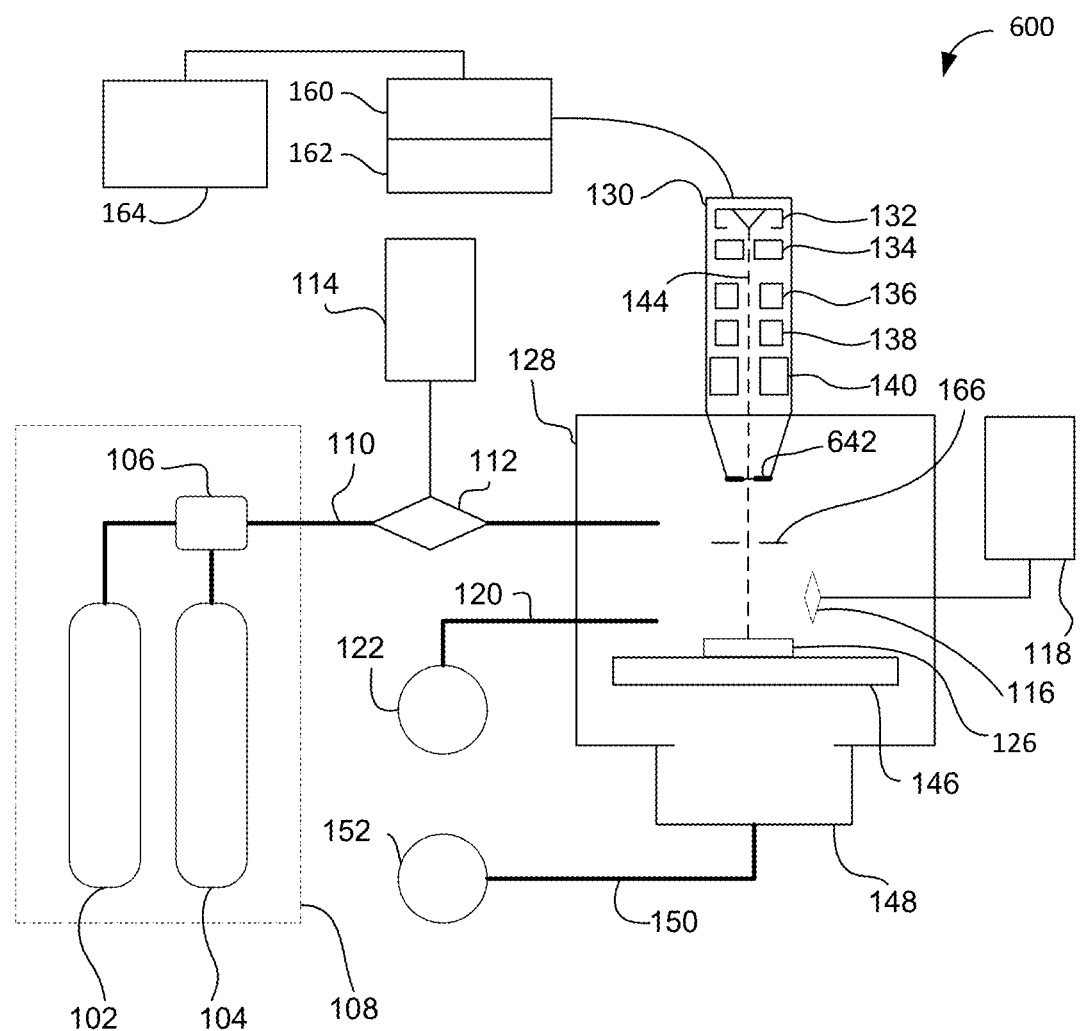
FIG. 6 shows a high pressure scanning electron microscope.

FIG. 6 shows a HPSEM 600 in which the vacuum chamber 128 is also the sample chamber, that is, there is no partially enclosed cell within vacuum chamber 128. Vacuum chamber 128 is filled with the process gas to the desired processing pressure. A pressure limiting aperture 642 maintains a lower pressure in focusing column 130. Elements that are common to FIG. 1 are shown using the same reference numbers. As in the system shown in FIG. 1, cold trap 112 reduces the amount of contaminating gases entering the vacuum chamber 128 and cold trap 116 reduces the amount of contaminating gases in the vacuum chamber. The preferred temperatures and other operating parameters are the same as described above with respect to FIG. 1

Figure 7:
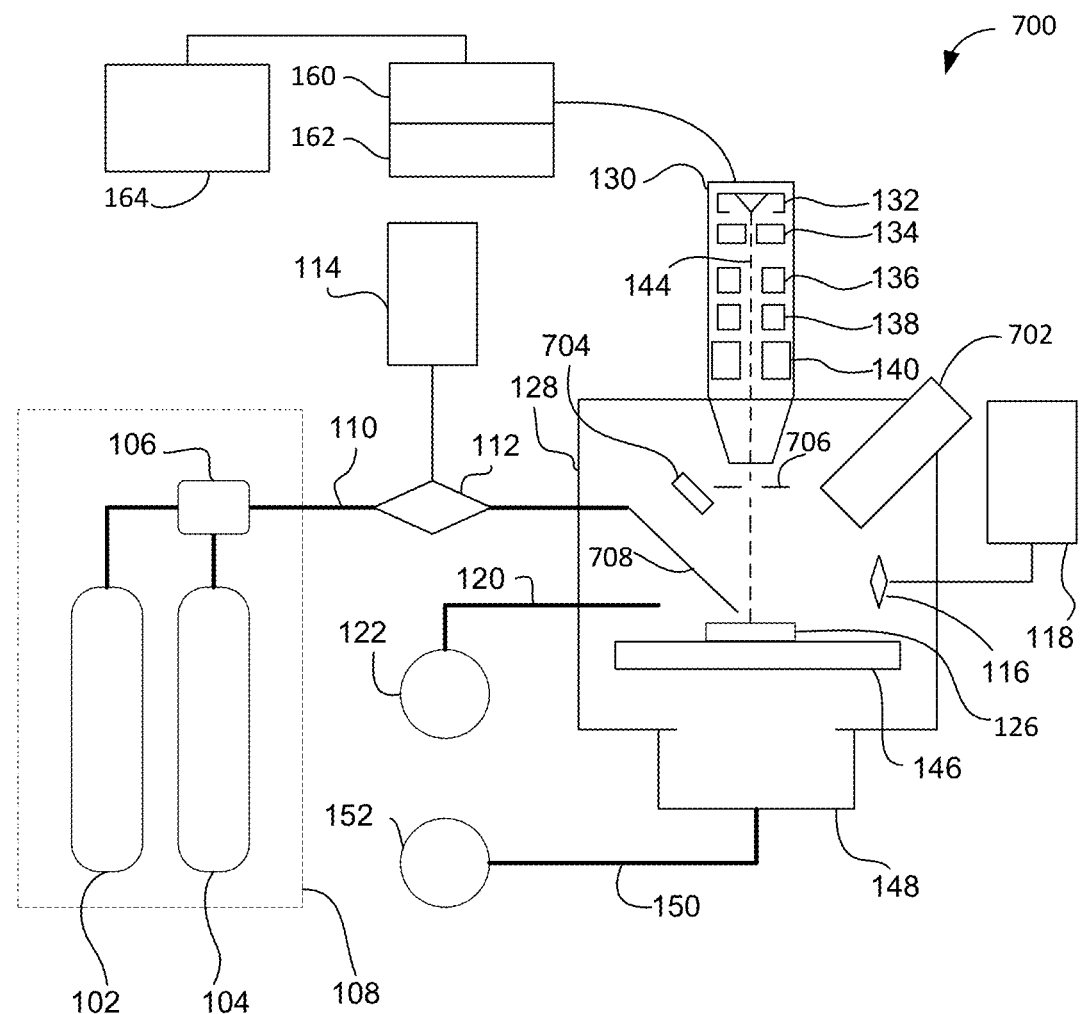
FIG. 7 shows a high vacuum dual beam system.

FIG. 7 shows a high vacuum dual beam system 700 that includes an electron beam column 130 and a focused ion beam column 702. Secondary electrons are detected using a scintillator photomultiplier 704. Backscattered electrons can be detected using backscatter electron detector 706. A process gas is directed toward the surface of sample 126 by a nozzle 708 that extends sufficiently close to sample 126 to maintain a relatively high concentration of process gas at the sample surface, while the background pressure in vacuum chamber 128 is relatively low. The background pressure is typically sufficiently low to detect secondary electrons using scintillator photomultiplier 704, which typically provides higher amplification than gas cascade amplification used in the system of FIG. 1 and FIG. 6, in which the chamber containing the sample is filled with gas. The background pressure in chamber 128 is sufficiently low that no PLA is required to maintain an acceptable vacuum in electron beam column 130 and ion beam column 702. Embodiments of the invention use the cold trap at the same time as using gas injection of a process gas.

While it is recognized that a focused ion beam will typically etch a sample even in the absence of a process gas because of the mass of the ions, reducing contamination in a focused ion beam reduces inadvertent reactions and improves process control of beam-induced etching and deposition.

The term "processing" as used herein includes both processing that alters the sample surface, such as etching and deposition, as well as imaging. The term "process gas" or "processing gas" is used to include a gas that is used for imaging or a gas that is used together with the charged particle beam to alter the sample. The term "imaging gas" is used to include a gas that is used primarily for imaging. The classes of gasses are not mutually exclusive, and some gasses may be used for both altering the sample and for forming an image.

The term "sample chamber" is used to indicate the chamber in which the sample is exposed to a process gas and a beam. In some embodiments, the sample chamber comprises a processing cell within a vacuum chamber. In some embodiments, the sample chamber is the vacuum chamber of an environmental SEM, and in some embodiments, the sample chamber is the primary vacuum chamber of an SEM, FIB, dual beam or other vacuum processing system. A cold trap is positioned in the sample chamber in which the sample is exposed to a gas and a beam.

Some embodiments of the invention provide a method of charged particle beam processing of a work piece in a processing chamber, comprising:

providing a process gas at the work piece surface;

directing a charged particle beam toward the work piece surface;

providing a cooled surface within the processing chamber, the temperature of the cooled surface being sufficiently cold to remove contaminants from the processing chamber but insufficiently cold to condense the process gas.

In some embodiments, providing a cooled surface within the processing chamber includes providing a surface having a temperature that is less than 30 degree Celsius greater than the condensation temperature of the process gas.

In some embodiments, providing a cooled surface within the processing chamber includes providing a cooled surface that is thermally isolated from the sample.

In some embodiments, providing a process gas includes providing a process gas that does not etch the work piece in the presence of the charged particle beam.

In some embodiments, providing a process gas includes providing an imaging gas that does not react with the work piece surface in the presence of the charged particle beam but that is sufficiently ionizable to be used in gas cascade amplification imaging.

In some embodiments, providing a process gas includes providing a deposition precursor gas.

In some embodiments, providing a process gas includes providing an etch precursor gas In some embodiments, the process gas comprises $O_2$, $N_2O$, $H_2$, $NH_3$, $Cl_2$, $HCl$, $NF_3$, Ar, He, Ne, Kr, Xe, or $N_2$.

In some embodiments, the temperature of the cooled surface is less than $-55$ C.

In some embodiments, providing a cooled surface within the processing chamber comprises controlling the temperature of the cooled surface by controlling a flow of liquid nitrogen in thermal contact with the cooled surface.

In some embodiments, providing a process gas at the work piece surface comprises directing a jet of process gas at the work piece surface, the background pressure in the process chamber being between $10^{-7}$ Pascals and $10^{-2}$ Pascals.

In some embodiments, directing a charged particle beam toward the work piece surface comprises directing a charged particle beam through a charged particle beam optical column and providing a process gas at the work piece surface comprises maintaining the work piece in a process chamber maintained at a pressure of between $10^{-1}$ Pascals and $10^4$ Pascals, and the chamber includes a pressure limiting aperture to restrict gas flow from the process chamber to the charged particle beam optical column.

In some embodiments, providing a process gas at the work piece surface comprises maintaining the work piece in a process chamber comprising an environmental cell maintained at a pressure of between $10^{-1}$ Pascals and $10^4$ Pascals, the environmental cell positioned within a sample chamber of a charged particle beam system and separated from the sample chamber by a pressure limiting aperture.

In some embodiments, providing a process gas at the work piece surface includes providing a process gas from a gas source through a gas line and further comprising providing a second cooled surface within the gas line, the second cooled surface being sufficiently cold to remove contaminants from the gas line, but insufficiently cold to condense the process gas.

In some embodiments, the temperature of the second cooled surface is between −200 C. and 5 C.

Some embodiments further comprise forming an image of the work piece using gas cascade amplification.

In some embodiments, providing a process gas at the work piece surface includes providing a gas composed of molecules that, upon reaction with electrons, decomposes to deposit a material onto the work piece surface or etch a material from the work piece surface.

Some embodiments of the invention provide a charged particle beam apparatus for processing a sample, comprising:
  a source of charged particles;
  a focusing column for focusing the charged particles;
  a processing chamber for containing a sample in a gaseous environment;
  a gas source for providing a process gas to the processing chamber;
  at least one pressure limiting aperture between the processing chamber and the focusing column to maintain a lower pressure in the focusing column than in the processing chamber; and
  a cooler for cooling a cryotrap surface in the processing chamber, the cooled cryotrap surface condensing contaminants from the processing chamber environment to prevent the contaminants from adsorbing to the sample surface.

In some embodiments, the charged particle beam apparatus includes a sample vacuum chamber in which the processing chamber comprises an environmental cell positioned within the sample chamber, with at least one pressure limiting aperture positioned between the environmental cell and the sample chamber.

In some embodiments, the charged particle beam apparatus includes a sample vacuum chamber that is vacuum isolatable from the focusing column and in which the processing chamber comprises the sample chamber.

In some embodiments, the sample chamber contains a scintillator photomultiplier detector.

In some embodiments, the sample chamber contains a solid state detector.

In some embodiments, the sample chamber contains a detector used to generate electron backscatter diffraction patterns.

In some embodiments, the sample chamber contains an x-ray detector.

In some embodiments, the sample chamber is an environmental scanning electron microscope sample vacuum chamber containing a gas cascade amplification detector.

In some embodiments, the cooler comprises a source of liquid nitrogen.

In some embodiments, the cooler comprises a thermoelectric cooler.

In some embodiments, the gas source comprises a source of an imaging gas that does not etch carbon in the presence of the charged particle beam.

In some embodiments, the gas source comprises a source of $O_2$, $N_2O$, $H_2$, $NH_3$, $Cl_2$, HCl, $NF_3$, Ar, He, Ne, Kr, Xe, or $N_2$.

In some embodiments, the apparatus further comprises:
  a gas line between the gas source and the processing chamber; and
  a second cryotrap surface positioned in the gas line.

In some embodiments, the apparatus further comprises a second cooler for cooling the second cryotrap surface.

Some embodiments of the invention provide a charged particle beam apparatus for processing a sample, comprising:
  a source of charged particles;
  a focusing column for focusing the charged particles;
  a processing chamber for containing a sample in a gaseous environment;
  a gas source for directing a process gas toward the work piece;
  a cooler for cooling a cryotrap surface in the processing chamber; and
  a controller for controlling the charged particle beam apparatus, the controller configured to direct the process gas toward the work piece while simultaneously cooling the cryotrap, the cooled cryotrap surface condensing contaminants from the processing chamber environment to prevent the contaminants from adsorbing to the sample surface.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. The invention has broad applicability and can provide many benefits as described and shown in the examples above. The embodiments will vary greatly depending upon the specific application, and not every embodiment will provide all of the benefits and meet all of the objectives that are achievable by the invention.

It should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a non-transitory storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of non-transitory computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Although much of the previous description is directed at mineral samples from drill cuttings, the invention could be used to prepare samples of any suitable material. The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

In the following discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. The accompanying drawings are intended to aid in understanding the present invention and, unless otherwise indicated, are not drawn to scale. Particle beam systems suitable for carrying out the present invention are commercially available, for example, from FEI Company, the assignee of the present application.

The various features described herein may be used in any functional combination or sub-combination, and not merely those combinations described in the embodiments herein. As such, this disclosure should be interpreted as providing written description of any such combination or sub-combination.

Although the present invention and its advantages have been described in detail, it should be understood that various changes, substitutions and alterations can be made to the embodiments described herein without departing from the scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of charged particle beam processing of a work piece in a processing chamber, comprising:
providing a process gas, defined as a gas used with a charged particle beam to image or alter a work piece, at the work piece surface;
directing a charged particle beam toward the work piece surface; and
providing a cooled surface within the processing chamber that is thermally isolated from the work piece, the temperature of the cooled surface being sufficiently cold to remove contaminant gas molecules from the processing chamber environment but insufficiently cold to condense the process gas.

2. The method of claim 1 in which providing a cooled surface within the processing chamber includes providing a surface having a temperature that is less than 30 degrees Celsius greater than the condensation temperature of the process gas.

3. The method of claim 1 in which providing a process gas includes providing a process gas that does not etch the work piece in the presence of the charged particle beam.

4. The method of claim 1 in which the process gas comprises $O_2$, $N_2O$, $H_2$, $NH_3$, $Cl_2$, HCl, $NF_3$, Ar, He, Ne, Kr, Xe, or $N_2$.

5. The method of claim 1 in which providing a cooled surface within the processing chamber comprises controlling the temperature of the cooled surface by controlling a flow of liquid nitrogen in thermal contact with the cooled surface.

6. The method of claim 1 in which providing a process gas at the work piece surface comprises directing a jet of process gas at the work piece surface, the background pressure in the processing chamber being between $10^{-7}$ Pascals and $10^{-2}$ Pascals.

7. The method of claim 1 in which directing a charged particle beam toward the work piece surface comprises directing a charged particle beam through a charged particle beam optical column and in which providing a process gas at the work piece surface comprises maintaining the work piece in a process chamber maintained at a pressure of between $10^{-1}$ Pascals and $10^4$ Pascals, the process chamber including a pressure limiting aperture to restrict gas flow from the process chamber to the charged particle beam optical column.

8. The method of claim 1 in which providing a process gas at the work piece surface comprises maintaining the work piece in a process chamber comprising an environmental cell maintained at a pressure of between $10^{-1}$ Pascals and $10^4$ Pascals, the environmental cell positioned within a sample chamber of a charged particle beam system and separated from the sample chamber by a pressure limiting aperture.

9. The method of claim 1 in which providing a process gas at the work piece surface includes providing a process gas from a gas source through a gas line and further comprising providing a second cooled surface within the gas line, the second cooled surface being sufficiently cold to remove contaminants from the gas line, but insufficiently cold to condense the process gas.

10. The method of claim 1 further comprising forming an image of the work piece using gas cascade amplification.

11. The method of claim 1 in which providing a process gas at the work piece surface includes providing a gas composed of molecules that, upon reaction with electrons, decomposes to deposit a material onto the work piece surface or etch a material from the work piece surface.

12. A charged particle beam apparatus for processing a sample, comprising:
    a source of charged particles;
    a focusing column for focusing the charged particles;
    a processing chamber for containing a sample in a gaseous environment;
    a gas source for providing a process gas, defined as a gas used with a charged particle beam to image or alter a sample, to the processing chamber;
    at least one pressure limiting aperture between the processing chamber and the focusing column to maintain a lower pressure in the focusing column than in the processing chamber;
    a cryotrap disposed inside the processing chamber, the cryotrap having a surface configured to be thermally isolated from the sample; and
    a cooler configured to cool the surface of the cryotrap to a temperature that is:
        sufficiently cold to prevent contaminant molecules present in the gaseous environment from adsorbing onto the surface of the sample by condensing the contaminant molecules out of the gaseous environment; and
        insufficiently cold to condense the process gas.

13. The apparatus of claim 12 in which the charged particle beam apparatus includes a sample vacuum chamber, and in which the processing chamber comprises an environmental cell positioned within the sample vacuum chamber, with at least one pressure limiting aperture positioned between an interior of the environmental cell and the sample chamber.

14. The apparatus of claim 12 in which the charged particle beam apparatus includes a sample vacuum chamber that is vacuum isolatable from the focusing column and in which the processing chamber comprises the sample vacuum chamber.

15. The apparatus of claim 14 in which the sample vacuum chamber contains a scintillator photomultiplier detector, a solid state detector, a detector used to generate electron backscatter diffraction patterns, or an x-ray detector.

16. The apparatus of claim 14 in which the sample vacuum chamber is an environmental scanning electron microscope sample vacuum chamber containing a gas cascade amplification detector.

17. The apparatus of claim 12 in which the cooler comprises a source of liquid nitrogen or a thermoelectric cooler.

18. The apparatus of claim 12 in which the gas source comprises a source of an imaging gas that does not etch carbon in the presence of the charged particle beam.

19. The apparatus of claim 12 in which the gas source comprises a source of $O_2$, $N_2O$, $H_2$, $NH_3$, $Cl_2$, HCl, $NF_3$, Ar, He, Ne, Kr, Xe, or $N_2$.

20. The apparatus of claim 12 further comprising:
    a gas line between the gas source and the processing chamber; and
    a second cryotrap surface positioned in the gas line.

21. The apparatus of claim 20 further comprising a second cooler for cooling the second cryotrap surface.

22. A charged particle beam apparatus for processing a sample, comprising:
    a source of charged particles;
    a focusing column for focusing the charged particles;
    a processing chamber for containing a sample in a gaseous environment;
    a gas source for directing a process gas, defined as a gas used with a charged particle beam to image or alter a sample, toward the sample;
    a cryotrap having a surface configured to be thermally isolated from the sample;
    a cooler for cooling the surface of the cryotrap; and
    a controller for controlling the charged particle beam apparatus, the controller configured to prevent contaminant gas molecules present in the gaseous environment from adsorbing onto the sample surface by:
        directing the cooler to cool the surface of the cryotrap to a temperature sufficiently cold to condense the contaminant gas molecules out of the gaseous environment but insufficiently cold to condense the process gas; and
        directing the process gas toward the sample while the surface of the cryotrap is at the temperature set by the cooler.

23. The apparatus of claim 12 in which the charged particle beam apparatus includes a sample vacuum chamber, and in which the processing chamber comprises an environmental cell positioned within the sample vacuum chamber, with at least one pressure limiting aperture positioned between an interior of the environmental cell and an interior space of the sample vacuum chamber surrounding the processing chamber.

* * * * *